(12) United States Patent
Knowles et al.

(10) Patent No.: US 7,812,269 B2
(45) Date of Patent: Oct. 12, 2010

(54) ACOUSTIC WAVE TOUCH DETECTION CIRCUIT AND METHOD

(75) Inventors: Terence J. Knowles, Barrington, IL (US); Wayne J. Wehrer, Austin, TX (US); Chris Kalmus, LaGrange, IL (US); Charles F. Bremigan, III, Jarrell, TX (US)

(73) Assignee: Illinois Tool Works Inc., Glenview, IL (US)

( * ) Notice: Subject to any disclaimer, the term of this patent is extended or adjusted under 35 U.S.C. 154(b) by 690 days.

(21) Appl. No.: 11/781,808

(22) Filed: Jul. 23, 2007

(65) Prior Publication Data
US 2007/0261895 A1    Nov. 15, 2007

Related U.S. Application Data

(62) Division of application No. 10/454,003, filed on Jun. 4, 2003, now Pat. No. 7,265,746.

(51) Int. Cl.
    *G06F 3/043* (2006.01)
(52) U.S. Cl. .................................... 178/18.04; 345/173

(58) Field of Classification Search ................ 345/156, 345/173; 178/18.01, 18.04, 19.04; 310/322, 310/334; 367/153, 176
See application file for complete search history.

(56) References Cited

U.S. PATENT DOCUMENTS

| 5,303,210 | A  | * | 4/1994 | Bernstein .................... 367/181 |
| 6,590,757 | B2 | * | 7/2003 | Pahl et al. ................... 361/93.2 |
| 7,511,704 | B2 | * | 3/2009 | Knowles et al. ............. 345/177 |

FOREIGN PATENT DOCUMENTS

EP    0 657 842    6/1995

* cited by examiner

*Primary Examiner*—Abbas I Abdulselam
(74) *Attorney, Agent, or Firm*—McAndrews, Held & Malloy, Ltd.

(57) ABSTRACT

A circuit for an acoustic wave switch or sensor having a resonant acoustic wave cavity detects a touch or sensed event using a time domain approach. The circuit includes a controller that drives an acoustic wave transducer to generate a resonant acoustic wave in the acoustic wave cavity during a first portion of a sampling cycle. In a second portion of the sampling cycle, the controller monitors the time that it takes for the acoustic wave signal from the transducer to decay to a predetermined level. Based on the decay time, the controller detects a sensed event, such as a touch on the acoustic wave switch/sensor.

66 Claims, 11 Drawing Sheets

ACOUSTIC WAVE TOUCH DETECTION CIRCUIT AND METHOD

CROSS-REFERENCE TO RELATED APPLICATIONS

This application is a division of U.S. patent application Ser. No. 10/454,003 entitled "Acoustic Wave Touch Detection Circuit and Method," filed Jun. 4, 2003, now U.S. Pat. No. 7,265,746, which is hereby incorporated by reference in its entirety.

FIELD OF THE INVENTION

The present invention relates to a touch detection circuit and method and more particularly, to a touch detection circuit and method for detecting the presence of a touch on a touch responsive surface of an acoustic wave cavity.

BACKGROUND OF THE INVENTION

There is a substantial need for finger touch actuated switches that are rugged and explosion proof, operate in the presence of liquids, have low power consumption, withstand aggressive sterilization procedures and are inexpensive. Known switches that attempt to meet these needs but fail include the following. A Qprox switch made by Quantum Research Group senses the presence of touch through a charge transfer effect. This switch is sensitive to conductive fluids and/or an ionizing atmosphere and can be made inoperable thereby. Further, the enclosure through which touch is sensed cannot be made of an electrically conducting material, so that metals and the like cannot be used. Piezoelectric switches such as supplied by Schurter or Wilson-Hurd, operate by transferring finger pressure via a metal overlay to a piezoelectric element which generates a voltage when compressed. This type of switch is expensive compared to a standard membrane switch and shares the disadvantages of membrane switches in that holes in the housing or enclosure are required to accommodate the switch. Further, the metal overlay is necessarily thin, so that the piezoelectric element is relatively unprotected against blows to the overlay. Another type of switch shown in U.S. Pat. No. 5,149,986 is based on the absorption of sound in a glass, ball-shaped button when the button is touched. In operation, a transducer sends sound waves into the glass balls and then receives back the echoes in a sonar type fashion. A circuit analyzes the echoes to determine whether the echoes have been reduced indicating a touch. This type of switch is relatively expensive and again requires openings in the housing or enclosure in which the switch is to be mounted.

An acoustic wave switch such as shown in U.S. Pat. No. 5,673,041 includes an ultrasonic piezoelectric transducer mounted on a surface of a substrate opposite a touch surface of the substrate. The transducer generates an ultrasonic wave that propagates in a direction across the thickness of the substrate to the touch surface and reflects off of the touch surface back to the transducer. The ultrasonic wave appears to be a compressional wave. A touch on the touch surface changes the acoustic reflectivity of the surface and changes the impedance of the transducer. The acoustic energy in this switch is not confined and spreads out into the plane of the substrate. As such, the ratio of the stored energy to lost or dissipated energy over a complete cycle, referred to as the Q of the switch, is inherently low and an extremely complex touch detection circuit is required to discriminate between a touch and the absence of a touch. Moreover, the use of compressional waves in this switch is undesirable due to their sensitivity to liquids and other contaminants which can render the switch inoperable.

Also known are acoustic wave touch panels that employ reflective gratings or arrays to reflect portions of an acoustic wave across a touch surface along parallel paths of differing lengths. These devices use a transparent substrate that can overlay a display to provide a touch screen or the like. Examples of such touch sensors are shown in U.S. Pat. Nos. 4,645,870 and 4,700,176 which utilize surface acoustic waves. These systems are undesirable, however, because surface acoustic waves are sensitive to liquids, sealing compounds and other contaminants that can render the panel inoperable and difficult to seal effectively. Another acoustic wave touch panel using reflective arrays is shown in U.S. Pat. No. 5,177,327. This touch panel uses shear waves and in particular the zeroth order horizontally polarized shear wave. Although this touch position sensor is insensitive to liquids and contaminants, touch position sensors that use reflective gratings or arrays and the associated touch detection circuitry are, in general, too expensive to use for an individual switch or for a small number of switches on a panel. Moreover, because the shear wave transducer in this latter system is mounted on a side of the panel to generate a shear wave that propagates in the plane of the substrate, an opening in the enclosure or housing is required to accommodate the panel. U.S. Pat. No. 5,573,077 also uses zeroth order horizontally polarized shear waves, but instead of reflective gratings, discrete transducers are used to propagate the shear waves along parallel paths extending across the substrate.

An acoustic wave switch that overcomes the above problems utilizes an acoustic wave cavity and an acoustic wave transducer to generate a resonant acoustic wave that is substantially trapped in the cavity as disclosed in U.S. patent application Ser. No. 09/998,355 filed Nov. 20, 2001. As discussed therein, an analog touch detection circuit includes an oscillator coupled to the acoustic wave transducer wherein the oscillator is configured to oscillate in the absence of a touch. A touch on the touch surface of the acoustic wave cavity causes the transducer impedance to drop so that the oscillator stops oscillating. The state of the oscillator is determined and when the oscillator stops oscillating, a touch is detected. This circuit operates very well to detect a finger touch and a touch by a leather glove, for example. However, because it is desirable to detect a touch by contact of a synthetic blend glove, or the like, with the touch responsive area of the acoustic wave cavity and at the same time to not detect a touch when water alone contacts the touch responsive area, the sensitivity level of this touch detection circuit must be set within very narrow limits to meet these two competing requirements. As a result, small changes in the transducer impedance over time and/or with variations in temperature can result in a change in sensitivity that is outside of the requisite limits of the circuit.

Further, there is a need for a simple circuit that is not effected by drift for detecting sensed events in acoustic wave sensors other than touch detection sensors.

BRIEF SUMMARY OF THE INVENTION

In accordance with the present invention, the disadvantages of prior acoustic wave sensor circuits have been overcome. In accordance with the present invention, an acoustic wave sensor circuit utilizes a time domain method for sensing an event. The circuit is simple and capable of automatically compensating for drift. Moreover, the circuit can distinguish between materials that have a small effect on the acoustic wave and liquids such as water or other contaminants.

In one embodiment, the circuit includes at least one transducer driven to generate a resonant acoustic wave in an acoustic wave resonator and is responsive to the acoustic wave to provide a signal representative thereof. A controller is responsive to the signal for determining a value representing the period of time that the acoustic wave decays to a predetermined level wherein the controller compares the determined value to a reference to sense an event.

In another embodiment of the present invention, the acoustic wave sensor is in the form of a touch detection sensor or switch. In this embodiment, the circuit forms a touch detection circuit that includes at least one transducer driven to generate an acoustic wave in an acoustic wave cavity, the transducer being responsive to the acoustic wave in the cavity to provide a signal representative thereof. A controller controls the driving of the transducer and the receipt of the acoustic wave signal from the transducer during a sampling cycle. The controller is responsive to the transducer signal to determine a number representing the period of time that the signal received from the transducer during a sampling cycle decays to a predetermined level. The controller compares the determined number for a sampling cycle to a touch reference to detect the presence of a touch on the acoustic wave cavity during the sampling cycle.

In accordance with another aspect of the invention, the touch detection circuit includes at least one transducer driven to generate an acoustic wave in an acoustic wave cavity during a sampling cycle, the transducer being responsive to the acoustic wave to provide a signal representative thereof for the sampling cycle. A comparator compares the amplitude of the acoustic wave signal for a sampling cycle to a first reference to generate a pulse when the amplitude of the acoustic wave signal is above the first reference. A counter counts the number of pulses from the comparator to provide a count for the sampling cycle. A processor compares the count for the sampling cycle to a second reference to detect a touch on the acoustic wave cavity.

In accordance with a further aspect of the present invention, a method of detecting a touch on a touch responsive area includes generating an acoustic wave in the touch responsive area; determining a value representing the period of time that the acoustic wave in the touch responsive area decays to a predetermined level in the absence of a touch to provide a reference; generating a subsequent acoustic wave in the touch responsive area; determining a subsequent value representing the time that the subsequent acoustic wave decays to the predetermined level and comparing the subsequent value to the reference to determine whether the subsequent value represents a touch on the touch responsive area. To compensate for drift and other changes, the reference can be updated periodically or in response to predetermined events.

In accordance with another aspect of the present invention, a method of detecting a malfunction of an acoustic wave switch includes generating an acoustic wave in an acoustic wave switch; providing a signal representing the acoustic wave in the acoustic wave switch; determining a value representing the period of time that the acoustic wave decays to a predetermined level; and comparing the determined value to a malfunction reference to determine whether the switch has malfunctioned or not.

In accordance with a further feature of the present invention, a method of detecting liquid interference with an acoustic wave sensor includes generating an acoustic wave in the acoustic wave switch during each of a plurality of sampling periods. The acoustic wave being insensitive to the liquid at certain levels of the liquid and the acoustic wave being sensitive to the liquid at other levels; providing a signal representing the acoustic wave in the acoustic wave switch in each of the sampling periods; and analyzing the signals in a predetermined number of consecutive sampling periods for variations among the signals indicative of the presence of an interfering liquid.

In accordance with a further feature of the present invention, an acoustic wave touch panel includes a substrate having a plurality of acoustic wave cavities formed therein where each acoustic wave cavity is defined by an area of increased mass. The substrate has a back surface and opposite thereto, a surface with touch responsive areas associated with the acoustic wave cavities. A transducer is positioned adjacent the back surface of each of the acoustic wave cavities. A circuit board includes a circuit for driving the transducers to generate an acoustic wave in each of the acoustic wave cavities. The circuit is also responsive to signals from the transducers representing the acoustic waves in the cavities to detect a touch. The circuit board includes a plurality of apertures, wherein the circuit board is bonded on the back surface of the substrate with each aperture aligned with a respective acoustic wave cavity. In accordance with one embodiment of the present invention, an insulator is disposed between the circuit board and the substrate. Further, a contact associated with each cavity for contacting the cavity's transducer is soldered to the circuit board so that the contact is cantilevered over the aperture aligned with the cavity.

These and other advantages and novel features of the present invention, as well as details of an illustrated embodiment thereof, will be more fully understood from the following description and drawings.

DETAILED DESCRIPTION OF THE INVENTION

Figure 1:
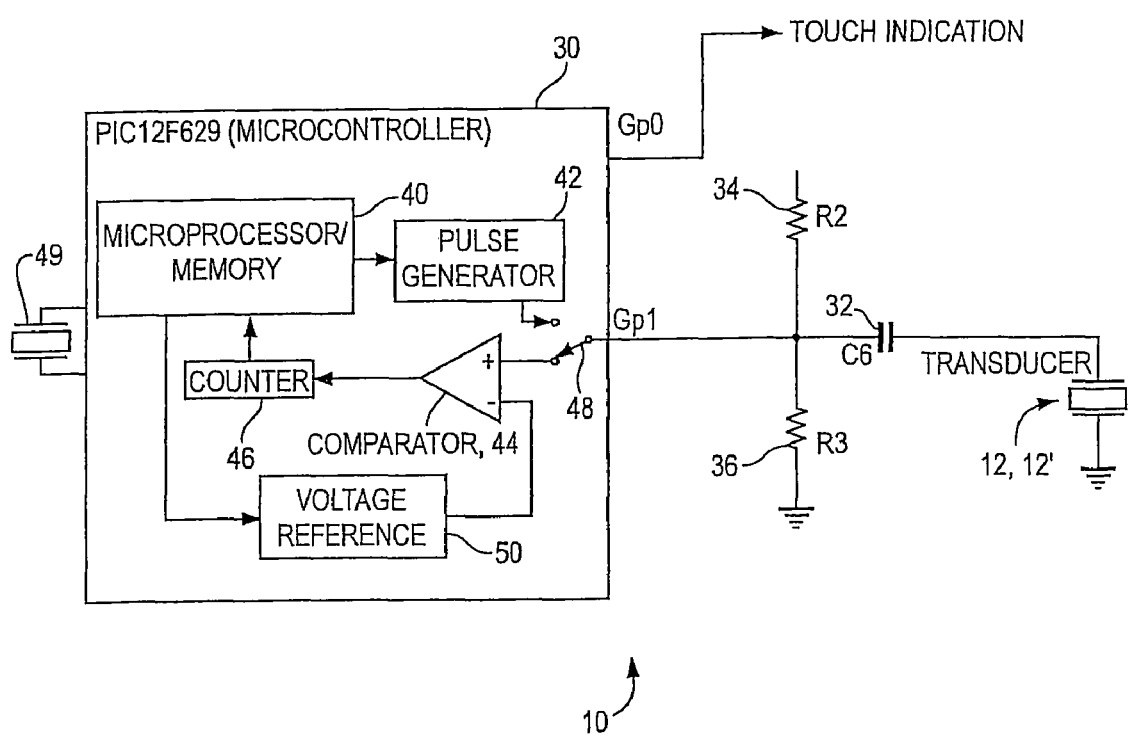
FIG. 1 is a block diagram illustrating the circuit of the present invention.

An acoustic wave sensor 10, in accordance with the present invention, as shown in FIG. 1 includes a transducer 12, 12' for generating an acoustic wave in an acoustic wave cavity. In one embodiment as shown in FIG. 2, the transducer 12 is mounted on the acoustic wave cavity and in a second embodiment, as shown in FIG. 3, the transducer 12' is mounted adjacent to the acoustic wave cavity.

Figure 2:
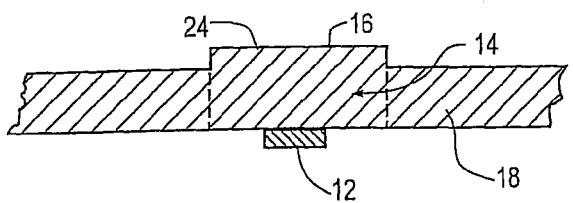
FIG. 2 is a cross-section of a substrate having an acoustic wave cavity formed therein with a transducer mounted on the cavity.
Figure 3:
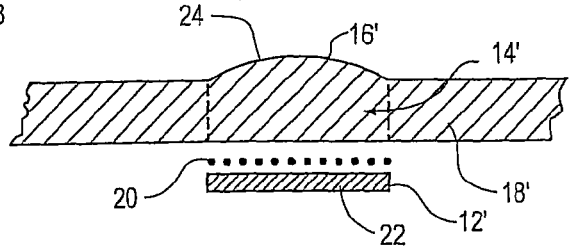
FIG. 3 is a cross-sectional view of a substrate with an acoustic wave cavity formed therein and an associated Electro-Magnetic Acoustic Transducer.

As shown in FIGS. 2 and 3, the acoustic wave cavity 14, 14' is defined by a raised area 16, 16', the cavity extending through the thickness of the substrate 18, 18' under the surface 24 of the raised area 16, 16'. The acoustic wave cavity 14, 14' is formed in the substrate 18, 18' such that the mass per unit surface area of the cavity 14, 14' is greater than the mass per unit surface area of the substrate immediately adjacent the cavity 14, 14'. It is noted, that the acoustic wave cavity can also be defined by an area of increased mass that is not raised above the substrate. Such cavities can be formed, for example, by depositing a thin layer of material on the surface of the substrate in an area defining the acoustic wave cavity. Such cavities can also be formed with materials of greater mass than the substrate throughout the cavity or in a portion thereof.

The raised area 16 defining the acoustic wave cavity may be square, rectangular, or other shapes. However, in a preferred embodiment, the raised area 16 has a circular circumference. The raised area may also be dome-shaped as shown at 16' in FIG. 3. Further, although the raised area 16, 16' is shown as an integral part of the substrate, the raised area may be formed as a separate piece such as a decal that is bonded to the substrate. In such an embodiment, the raised area may be formed of the same material as the substrate or of a different material. Moreover, although the transducer 12 and 12' are respectively shown mounted on and adjacent a surface of the substrate opposite the raised area 16, 16', the transducer 12, 12' can be mounted on or adjacent the raised area 16, 16' as well.

The transducer 12 may be a piezoelectric transducer mounted directly on the acoustic wave cavity 14 as shown in FIG. 2 and described in detail in U.S. patent application Ser. No. 09/998,355 filed Nov. 20, 2001 and incorporated herein by reference. Alternatively, the transducer 12' may be an electromagnetic acoustic transducer or EMAT 12' mounted adjacent the cavity 14' as shown in FIG. 3 and described in detail in U.S. patent application Ser. No. 10/245,246 filed Sep. 17, 2002 and incorporated herein by reference. The circuit 10 of the present invention is particularly advantageous for use with EMATs because the EMAT need only have a single coil 20 which, in conjunction with the magnet(s) 22, generates an acoustic wave in the acoustic wave cavity 14' and which also provides a signal representing the acoustic wave. This is unlike the EMATs disclosed in U.S. patent application Ser. No. 10/245,246 which have separate drive and pick up coils. Although, it should be appreciated that, an EMAT with multiple coils can be used with the circuit 10 of the present invention as well.

The acoustic wave cavity 14, 14' traps a standing wave or a resonant acoustic wave in the cavity 14, 14'. As such, the acoustic wave cavity 14, 14' is an acoustic wave resonator. The cavity 14, 14' can trap various types of acoustic waves. For example, the transducer 12 can be positioned along a centerline or diameter of the cavity 14 to generate a trapped shear wave of a higher mode than the zeroth order mode in the cavity 14. Such a shear wave can also be generated by an EMAT generally aligned with the center of the cavity 16'. However, one or more transducers can be positioned with respect to the cavity 14, 14' to generate trapped or resonant acoustic waves other than shear waves as well. It should be appreciate that, the circuit 10 of FIG. 1 is not limited to any particular type of resonant acoustic wave.

The circuit 10 includes a controller 30 that is coupled to the acoustic wave transducer 12, 12'. A capacitor 32 is connected between the transducer 12, 12' and a pair of resistors 34 and 36 wherein the resistors set the D.C. level of the transducer signal. The controller 30 drives the transducer 12, 12' to generate an acoustic wave signal in the cavity in a first portion of a sampling cycle and in a second portion of the sampling cycle, the controller 30 is responsive to the signal from the transducer 12, 12' representing the acoustic wave in the acoustic wave cavity to analyze the signal for a sensed event. The sensed event can be the presence of a particular component in a liquid for a liquid phase sensor, a touch on the acoustic wave cavity 14, 14', the malfunctioning of a switch, etc. These are just a few of the events that can be sensed in accordance with the present invention.

Figure 10:
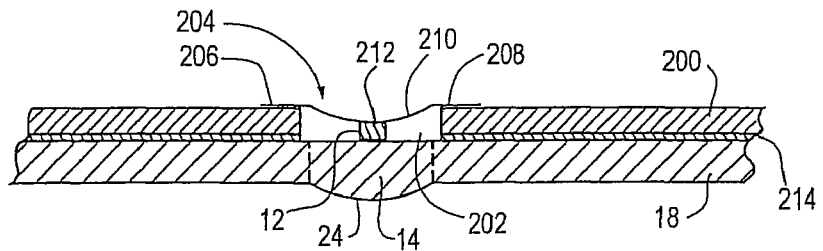
FIG. 10 is a cross-sectional view illustrating the mounting of a circuit board for the circuit of FIG. 1 on a substrate with one or more acoustic wave cavities formed therein.

As an example, the circuit of FIG. 10 will be described below for sensing or detecting a touch on a touch responsive surface 24 of the acoustic wave cavity 14, 14'. It should be appreciated that, as used herein, a touch on the acoustic wave cavity refers to contact of any member, material, composition, liquid, etc. with a surface of the acoustic wave cavity, the contact producing a detectable change in the acoustic wave trapped in the acoustic wave cavity 14, 14'.

The controller 30 may be a PIC12F629 microcontroller that includes a microprocessor 40 with associated memory, a pulse generator 42, a comparator 44 and a timer or counter 46. An oscillator 49 provides a clock input to the controller, timers, etc. The controller 30 also includes a switch 48 that is controlled by the microprocessor 40 to switch line Gp1 from an output line in the first portion of the sampling cycle to an input line in the second portion of the sampling cycle. More particularly, in the first portion of the sampling cycle, the switch 48 couples the line Gp1 to the pulse generator 42 so that under the control of the microprocessor 40, the pulse generator 42 outputs one or more pulses to the transducer 12, 12' to generate a resonant acoustic wave in the acoustic wave cavity 14, 14'. In the second portion of the sampling cycle, the microprocessor 40 controls the switch 48 to couple the line Gp1 to the comparator 44 so that the signal from the transducer 12, 12' representing the acoustic wave in the acoustic wave cavity will be coupled to the comparator 44.

Figure 4:
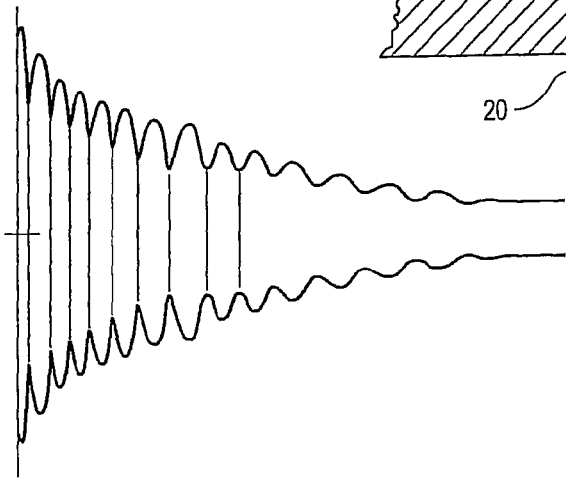
FIG. 4 is an illustration of an acoustic wave transducer signal for an untouched acoustic wave cavity.
Figure 5:
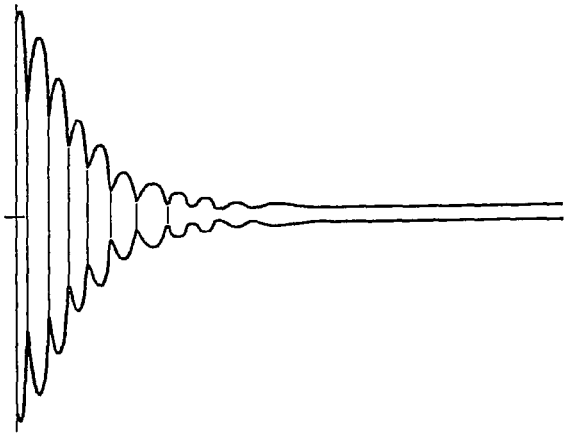
FIG. 5 is an illustration of an acoustic wave transducer signal for an acoustic wave cavity that is touched by a synthetic blend glove.
Figure 6:
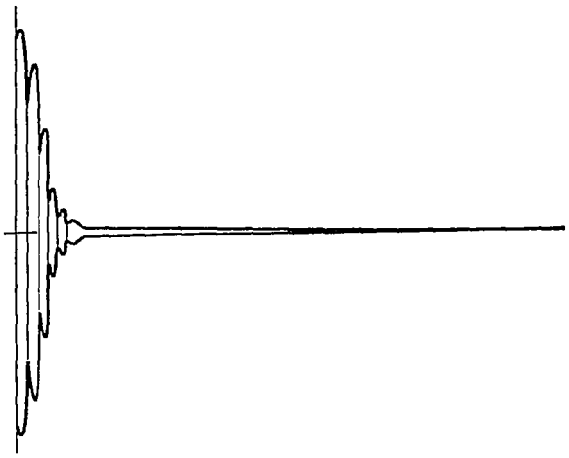
FIG. 6 is an illustration of an acoustic wave transducer signal for an acoustic wave cavity that is touched by a finger.

The transducer 12, 12' may be driven by one pulse from the controller 30 in the first portion of the sampling cycle. Alternatively, the transducer may be driven by multiple pulses, in which case the pulse frequency should be within ten to fifteen percent of the resonant frequency of the cavity 14. Preferably, the pulse frequency is within plus or minus five percent of the cavity's resonant frequency. When the transducer 12, 12' is driven by one or several drive pulses to generate a resonant acoustic wave in the cavity 14, 14', after the drive pulses cease to be applied to the transducer, the acoustic wave continues to resonate in the cavity but the amplitude of the wave gradually decreases over time. The voltage across the transducer 12, representing the acoustic wave in an untouched acoustic wave cavity 14 that is driven by one or several pulses is depicted in FIG. 4. FIG. 5 illustrates the transducer signal representing the acoustic wave in an acoustic wave cavity that is touched by a synthetic blend glove. FIG. 6 illustrates the transducer signal representing the acoustic wave in an acoustic wave cavity touched by a finger. As can be seen from FIGS. 4, 5 and 6, the acoustic wave signal in an acoustic wave cavity that has been touched (FIGS. 5, 6) decays to a predetermined level in a shorter period of time than the acoustic wave in an untouched cavity (FIG. 4). The controller 30, as discussed below, determines a value representing the period of time that the acoustic wave signal for a sampling cycle decays to a predetermined level and the controller 30 compares the determined value for a sampling cycle to a touch reference to detect the presence of a touch on the acoustic wave cavity during the sampling cycle. In one embodiment of the present invention as discussed below, the value representing the period of time that the acoustic wave signal decays to a predetermined level is the number of cycles of the acoustic wave signal, during a given scan count time of a sampling cycle, having an amplitude above a predetermined level.

More particularly, during the second portion of the sampling cycle, the acoustic wave signal from the transducer 12, 12' is coupled by the switch 48 to one input of the comparator 44. The comparator compares the acoustic wave signal to a predetermined reference voltage input to a second input of the comparator 44 by the microprocessor/memory 40. Preferably, the reference voltage 50 is a programmable value. The output of the comparator goes high when the acoustic wave signal is above the reference signal and the output of the comparator goes low when the acoustic wave signal falls below the reference signal. Because the acoustic wave signal is cyclical, the comparator generates an output pulse for each cycle of the acoustic wave that is greater than the predetermined reference. The output of the comparator 44 is coupled to a counter 46 that counts the number of pulses generated during a scan count time as discussed in detail below. The number of pulses, representing the period of time that the acoustic wave signal decays to a predetermined level represented by the reference signal 50, is applied to the microprocessor 40. The microprocessor 40 is responsive to the number output from the counter 46 to compare that number to a second reference representing a sensed event or in the case of a touch detection circuit, a touch on the acoustic wave cavity 14, 14'.

Figure 7A:
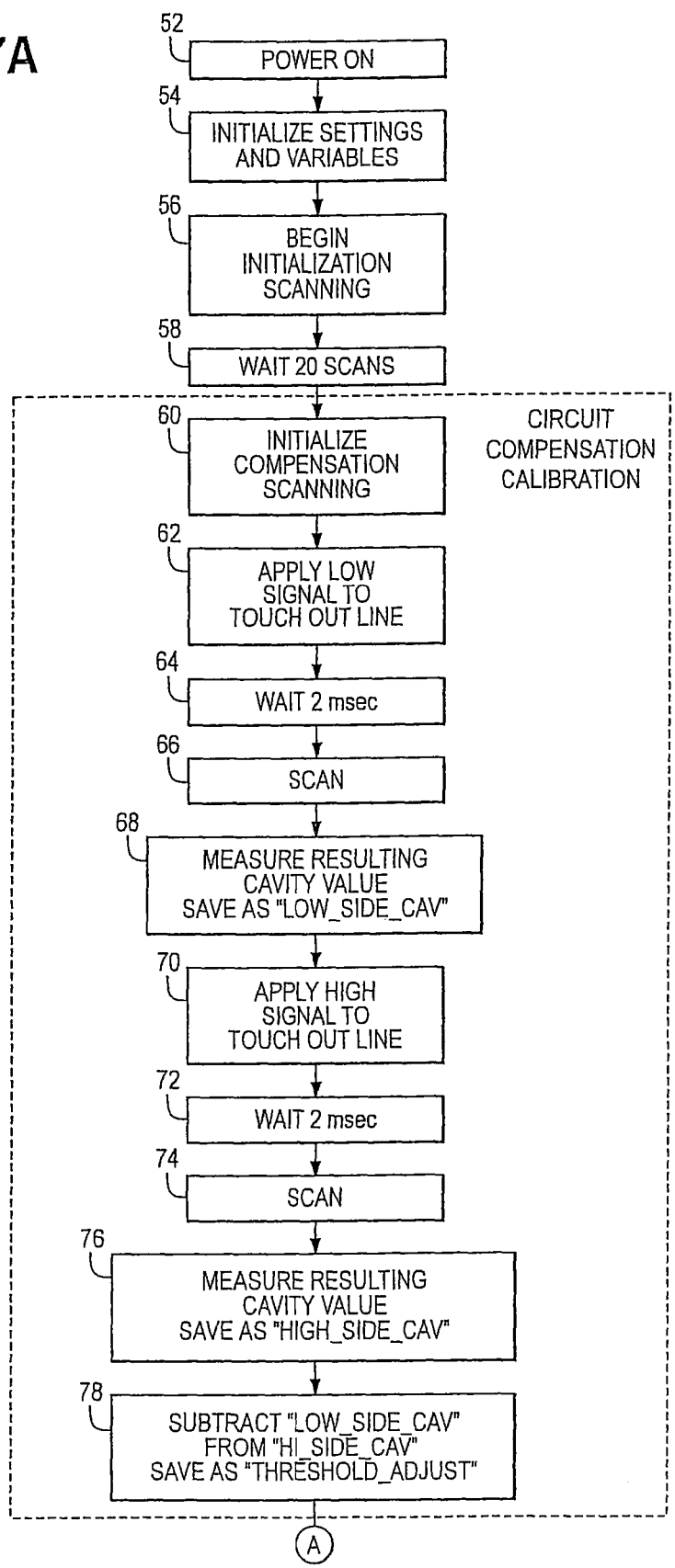
FIGS. 7A-B illustrate a flow chart for initializing and starting a scan or sampling cycle.
Figure 7B:
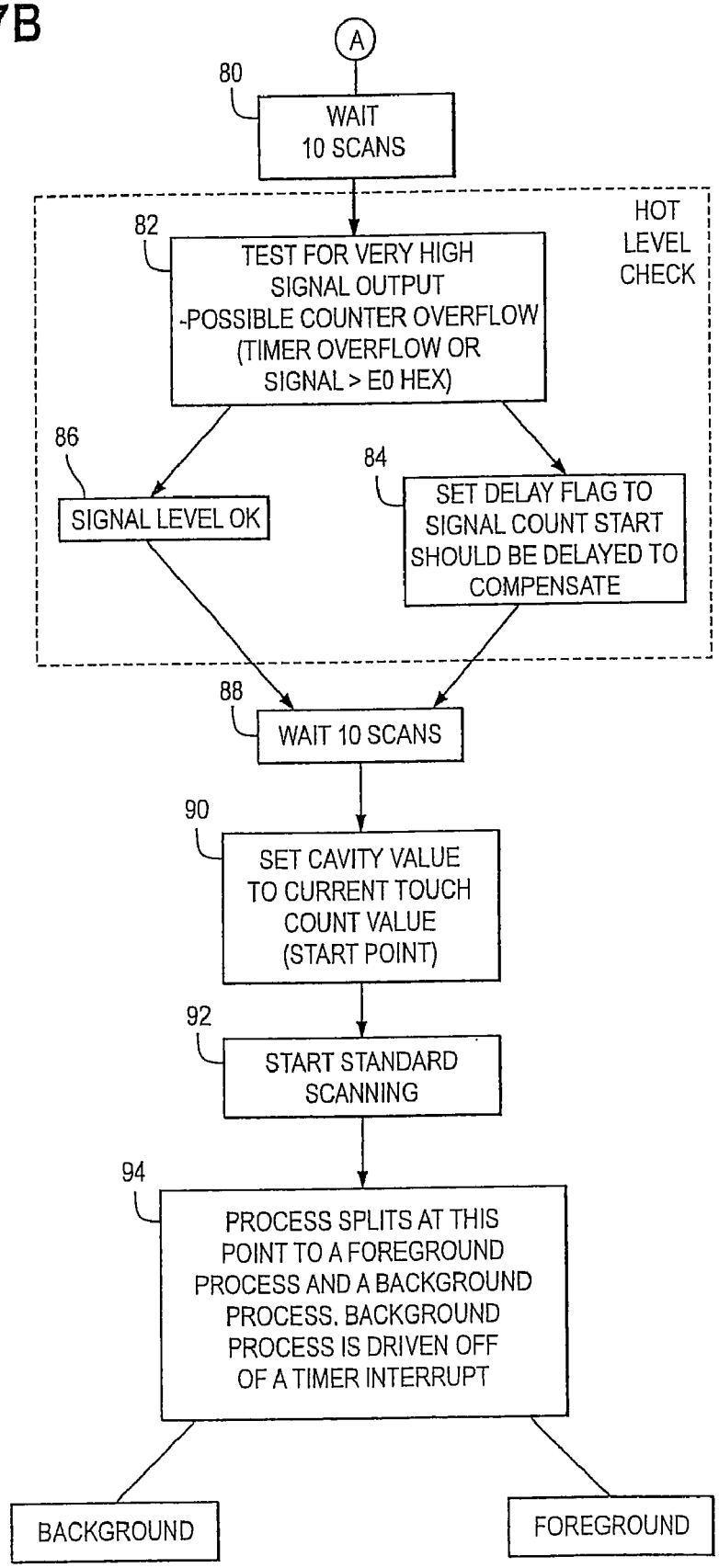

The microprocessor 40 operates in accordance with the flow charts depicted in FIGS. 7A-B, 8 and 9A-E. As shown in FIG. 7A, when the touch detection circuit 10 is powered on, as determined at block 52, the microprocessor at block 54 initializes various settings and variables. Thereafter, at block 56, the microprocessor begins the initialization scanning. During this initialization scanning, six to ten pulses are coupled to the transducer 12, 12' during a scan, i.e. a sampling cycle, to drive the transducer 12, 12' to generate a resonant acoustic wave in the acoustic wave cavity. Although the transducer 12 generates a signal representing the acoustic wave in each of the scans or sampling cycles, during the initialization scanning process, the microprocessor does not analyze the acoustic wave signal. The initialization scanning which proceeds over approximately 20 scans as depicted at block 58 allows the system to stabilize when power is first turned on. It is noted that each scan, i.e. sampling cycle, is extremely short being on the order of 300 microseconds to 4 milliseconds so that the time that it takes to perform the 20 scans of the initialization scanning is a negligible period of time. After completing the initialization scanning process, the microprocessor proceeds from block 58 to block 60 to begin a circuit compensation calibration routine.

The circuit compensation calibration routine compensates for current leakage in the circuit 10. This is an optional routine and may not be needed. At block 60, the microprocessor initializes the compensation scanning by setting a flag that indicates that the compensation calibration routine is in effect. At block 62, the microprocessor applies a low signal to the output line Gp0 shown in FIG. 1. After waiting 2 msec at block 64, the microprocessor at block 66 initiates a scan or sampling period by applying six to ten pulses to the transducer 12, 12'. At block 68, the microprocessor switches to the second portion of the scan or sampling cycle and measures the resulting count from the counter 46. This count value is saved as a "low_side_cav" value. Thereafter, at block 70, the microprocessor applies a high signal to the output Gp0 of the controller 30. After waiting to 2 msec at block 72, the microprocessor at block 74 again initiates a scan or sampling cycle by driving the transducer 12 with six to ten pulses. At block 76, the microprocessor moves the switch 48 so that the acoustic wave signal from the transducer is coupled to the comparator 44 and the microprocessor 40 saves the resulting count from the counter 46 as a "high_side_cav" value. At block 78, the microprocessor subtracts "low_side_cav" from "high_side_cav." The resulting difference is saved as "threshold_adjust." From block 78, the microprocessor proceeds to block 80 and initiates ten scans to isolate one process from another. After the ten scans have been completed at block 80, the microprocessor 40 proceeds to block 82 to start a hot level check.

The hot level check is a check for an extremely sensitive acoustic wave cavity that produces a large number of acoustic wave signal cycles above the predetermined reference value 50 when the transducer 12, 12' is driven by one or more of the drive pulses. At block 82, the microprocessor checks for a very high signal output indicated by an overflow of the counter 46 or a count that is greater than E0 Hex. If the value of the counter 46 indicates a very high signal output, the microprocessor proceeds from block 82 to block 84 to set a delay flag. The delay flag signals the microprocessor that the count should be delayed for a predetermined period of time to compensate for the high signal output. This delay may be accomplished by delaying the moving of the switch 48 from the pulse generator 42 to the comparator 44 so as to reduce the number of pulses output from the comparator 44 to the counter 46 for a very sensitive acoustic wave cavity so that the counter 46 does not overflow. The delay can also be accomplished by delaying the resetting of the counter 46 wherein the counter 46 does not start counting until the counter is reset. If the microprocessor determines at block 82 that the signal output is not too high, the microprocessor proceeds to block 86 indicating that the signal level does not need to be compensated for. From blocks 84 or 86, the microprocessor proceeds to block 88 to initiate ten scans before beginning the next process.

At block 90, the microprocessor 40 sets a "cavity value" to the current "touch count." The "cavity value" represents a running average of an untouched state and is calculated as described below. The "touch count" is the count from the counter 46 generated during the scan count time for one sampling cycle or scan. At block 92, the microprocessor then begins the standard scanning, i.e. sampling cycle. In particular, at block 92, the microprocessor 40 controls the pulse generator 42 to provide, for example, six to ten pulses to the transducer 12, 12' so as to drive the transducer to generate an acoustic wave in the acoustic wave cavity for one sampling cycle. At block 94, the software or firmware splits into a foreground process and a background process. The foreground process as depicted in FIG. 8 is continuously running but is interrupted by a timer interrupt that causes the background process depicted in FIGS. 9A-E to be implemented.

Figure 8:
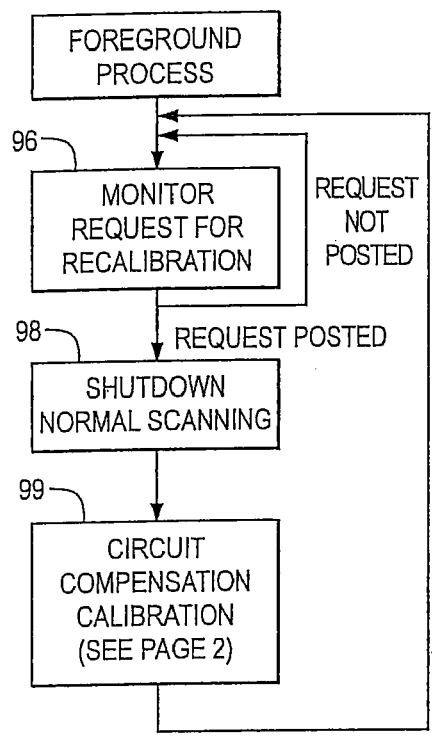
FIG. 8 is a flow chart illustrating a foreground process.

As shown in FIG. 8, the foreground process or routine begins at block 96. At block 96, the microprocessor 40 looks for a request for recalibration. If a request for recalibration flag has not been set, the microprocessor 96 loops back to again monitor for a request. When a request has been posted, the microprocessor proceeds from block 96 to block 98 to shut down the normal scanning operation which began at block 92. Thereafter, at block 99, the microprocessor re-implements the circuit calibration routine depicted in FIG. 7A at blocks 60-78. After finishing the circuit calibration routine, the microprocessor proceeds to block 92 to resume the standard scanning operation.

The background process or routine depicted in FIGS. 9A-E starts when a timer 1 interrupt is generated. The timer 1 interrupt is generated at the end of the scan count time for a given sampling cycle. At block 100, the microprocessor 40 saves the "touch count" which, again, is the number of pulses counted by the counter 46 for a given scan, i.e. sampling cycle during the scan count time. At block 102, the microprocessor 40 determines whether the counter 46 has overflowed and if so, the microprocessor 40 sets the hot level check flag. This is a re-check for the hot level to again enable a highly sensitive acoustic wave cavity to be compensated for. Thereafter, at block 104, the microprocessor looks at the previous output on line Gp0. If the previous output was a 1 indicating a touch, the microprocessor 40 adds the "threshold_adjust" value determined at block 78 to the current threshold. It is noted, that if no adjustment is needed, the value of "threshold_adjust" will be zero. At block 106, the microprocessor 40 determines whether the "touch count" saved at block 100 is less than the current threshold. The current threshold is used as a touch reference. The current threshold may be a fixed value but in a preferred embodiment, it is a determined value to compensate for drift or other changes. If the "touch count" value is less than the threshold, i.e. touch reference, as determined at block 106, the microprocessor at block 110 sets a "touch current" flag to 1. If the "touch count" value is not less than the threshold as determined at block 106, the microprocessor 40 at block 108 sets the "touch current" flag to 0. Thereafter, the microprocessor proceeds from blocks 108 and 110 to block 112.

At blocks 112, 114 and 118, the microprocessor 40 determines whether the "touch count" values for ten consecutive scans or sampling periods have indicated a touch or a no touch condition. The microprocessor 40 looks for ten consecutive touch indications before registering an actual touch so as to prevent a touch from being indicated on the output Gp0 as a result of a transient contact with an acoustic wave cavity. Similarly, the microprocessor 40 looks for ten no touch indications before registering a no touch condition on Gp0 for stability of the detection process. More particularly, at block 112, the microprocessor 40 determines whether the "touch current" value set at either blocks 108 or 110 matches the "touch current" value from the previous scan. If so, the microprocessor 40 proceeds from block 112 to block 114 to increment a touch current count value. Thereafter, at block 118, the microprocessor 40 determines whether a touch current count matches a touch hysteresis value. The touch hysteresis value represents the number of consecutive touch values that must be detected at block 108 before an actual touch is reported on the output Gp0. In this example, the touch hysteresis value is set equal to ten. If the touch current value does not match the previous touch current value as determined at block 112, the microprocessor proceeds to block 116 to reset the touch current count. From block 116, the microprocessor proceeds to block 128 to trigger a new sampling cycle, i.e. new scan, by sending out the preprogrammed number of pulses to drive the transducer 12, 12'. Similarly, if the touch hysteresis value has not been met as determined at block 118, the microprocessor 40 proceeds to block 128 to trigger a new sampling cycle.

When the touch hysteresis value has been met indicating ten consecutive touch or ten consecutive no touch detections at blocks 108 and 110, the microprocessor proceeds from block 118 to block 120. At block 120, the microprocessor 40 determines whether the system is in the diagnostic mode and if so, the microprocessor proceeds to block 124 to report various diagnostic data as discussed in detail below. If the system is not in the diagnostic mode, the microprocessor 40 proceeds from block 120 to block 122. At block 122, the microprocessor 40 provides either a touch or a no touch signal on Gp0 based on whether the ten consecutive scans indicated a touch or no touch condition. From blocks 122 or 124, the microprocessor 40 proceeds to block 126 to determine whether the report was of a touch or a no touch condition. If a touch was reported, the microprocessor 40 proceeds from block 126 to block 128. If the condition reported was a no touch condition, the microprocessor proceeds to block 144 to begin a process for updating the "cavity value" which represents a running average touch count value for an untouched acoustic wave cavity. As discussed below, the "cavity value" determines the threshold or touch reference to be used to detect a touch or no touch condition.

Figure 9A:
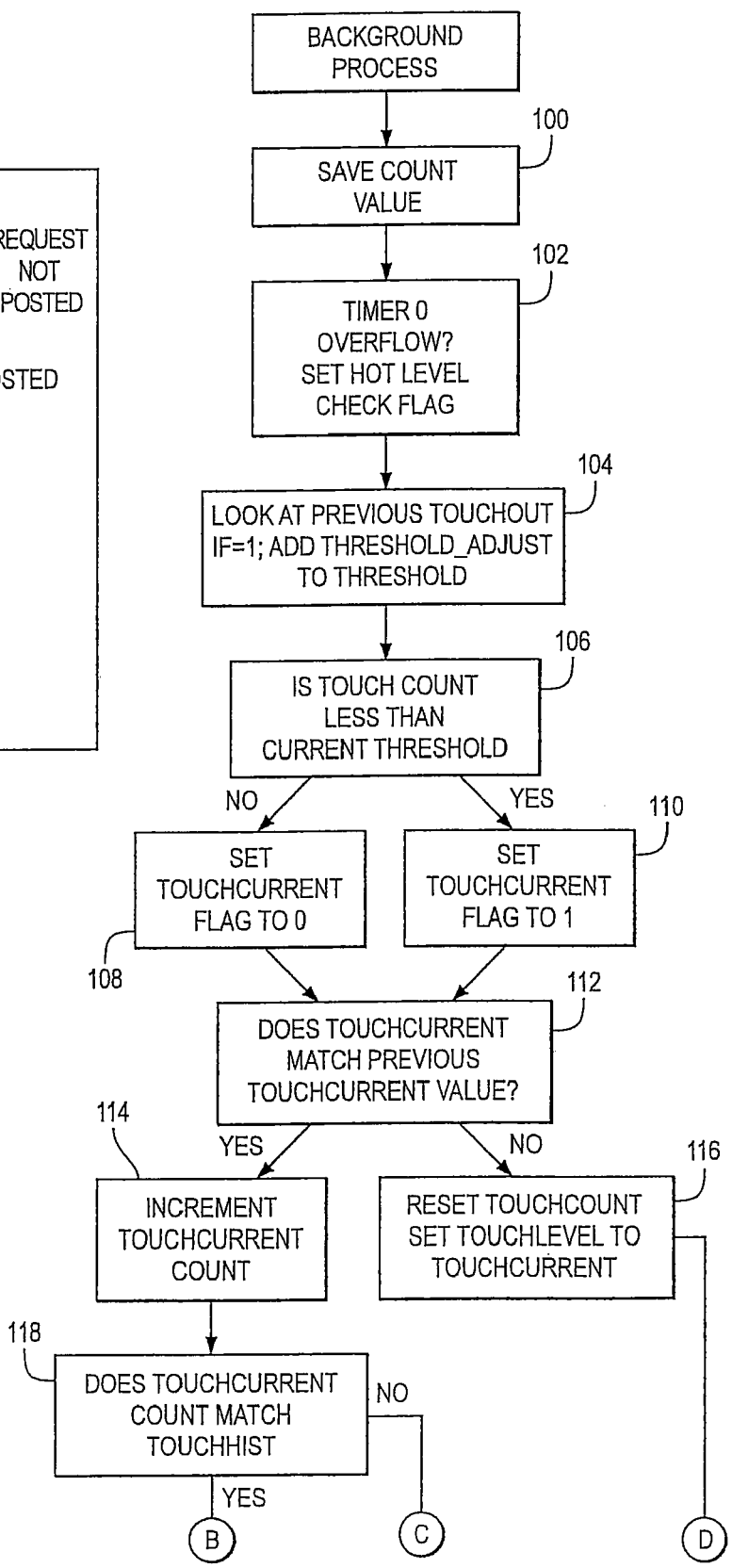
FIGS. 9A-E form a flow chart illustrating a background process.
Figure 9B:
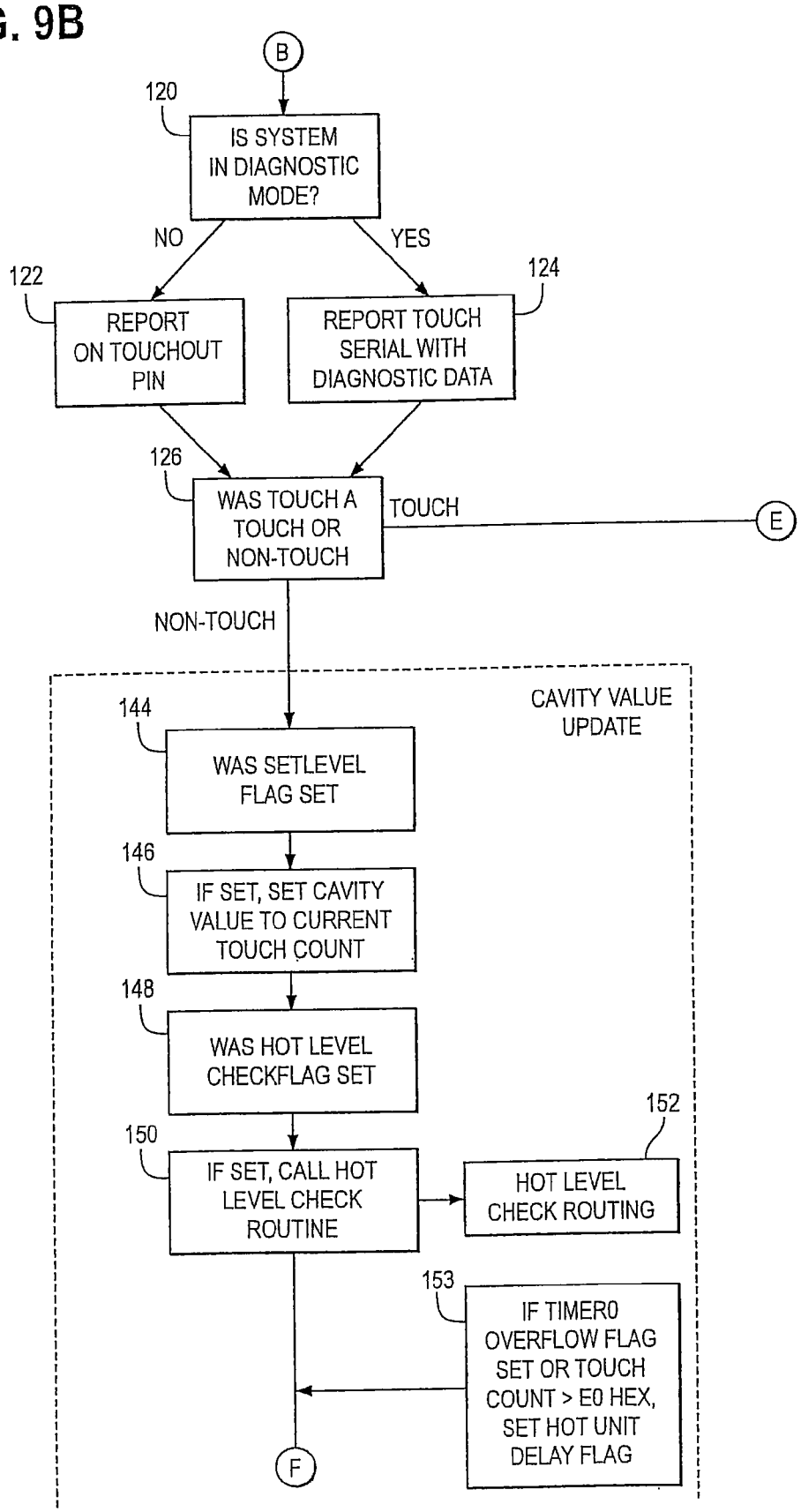
Figure 9C:
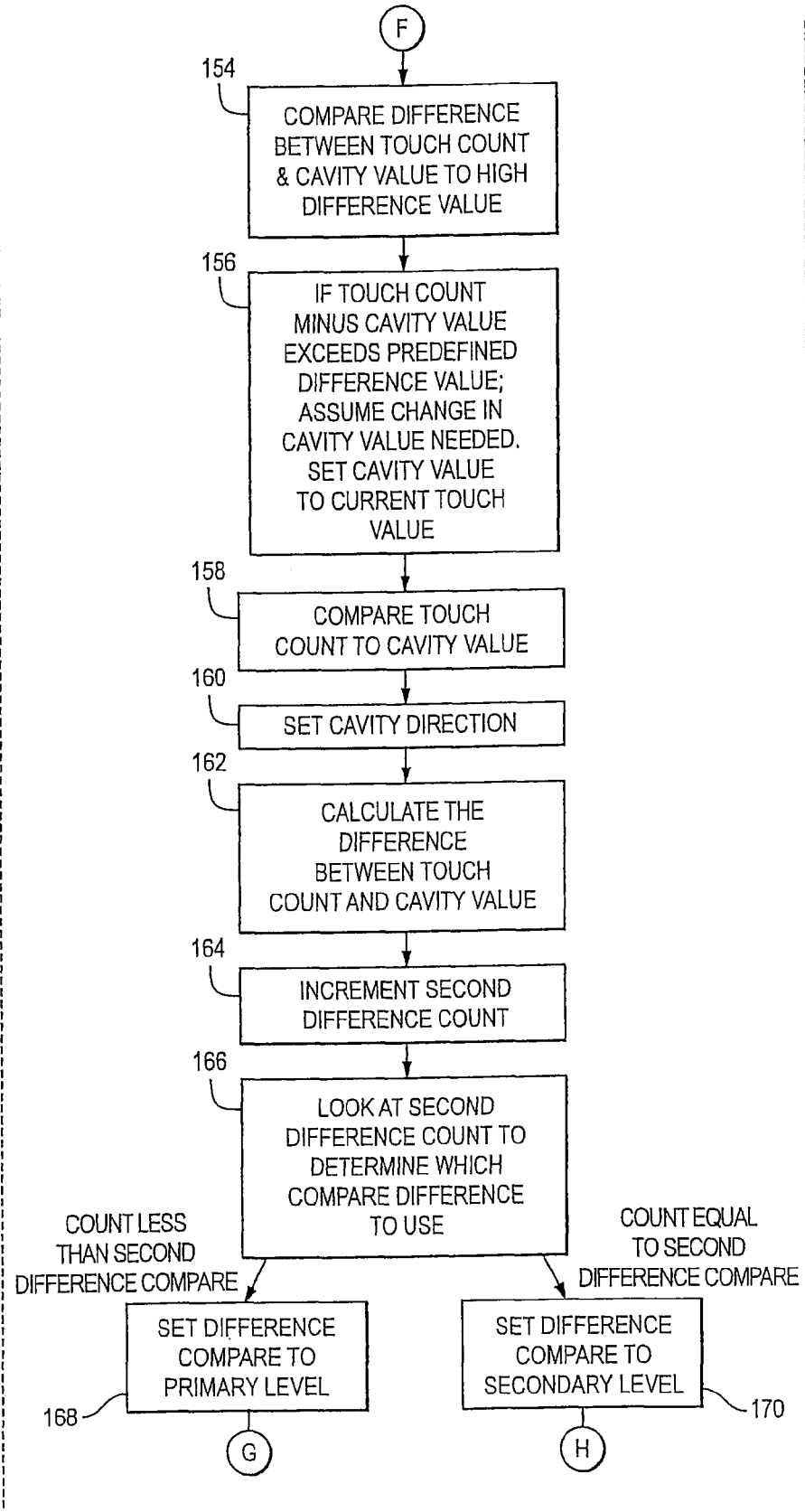
Figure 9D:
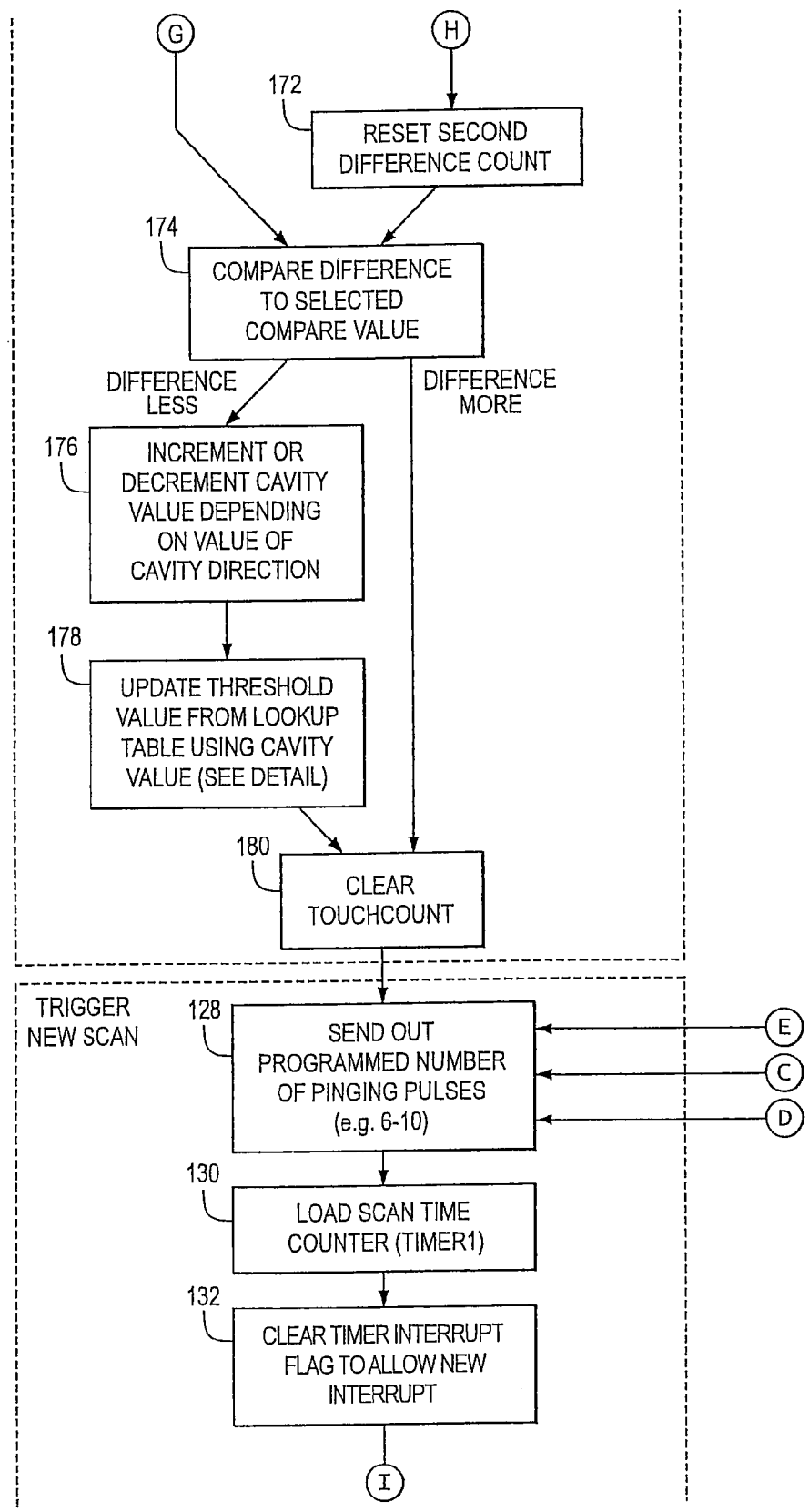
Figure 9E:
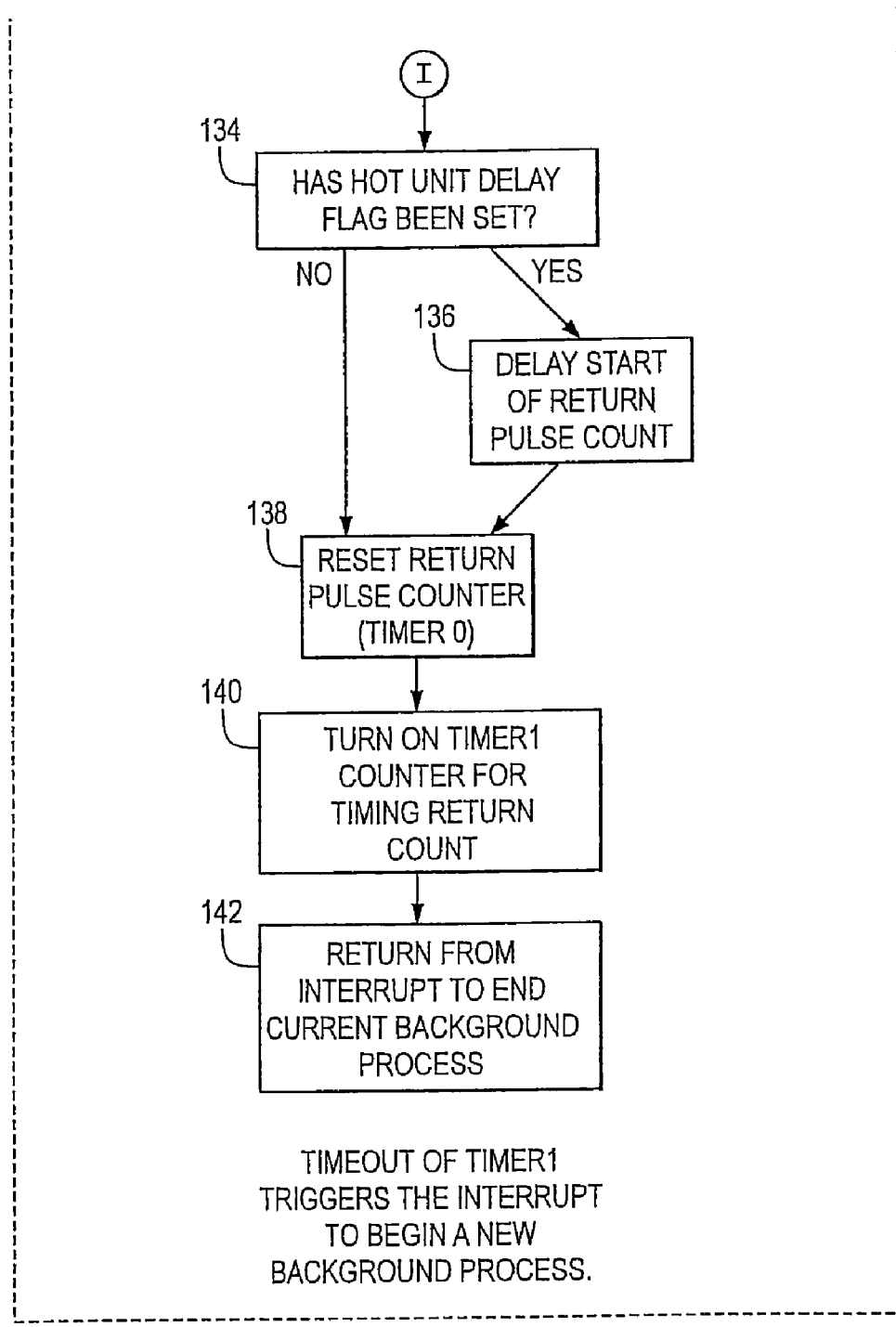

If a touch was reported at block 122, the microprocessor proceeds from block 126 to block 128 as shown in FIG. 9D. At block 128, the microprocessor 40 sends out the programmed number of pulses to drive the transducer 12, 12' to generate an acoustic wave signal in the acoustic wave cavity for a scan, i.e. one sampling cycle. Although as shown at block 120, the program number of pulses is typically between six to ten pulses. It should be apparent that more than ten pulses can be used to generate a resonant acoustic wave in the acoustic wave cavity during the first portion of the sampling cycle. After the microprocessor 40 controls the pulse generator 42 to output the programmed number of pulses via the switch 48 to the transducer 12, 12' for the first portion of a scan or sampling cycle, the microprocessor proceeds to block 130. At block 130, the microprocessor 40 loads, timer 1, which is an internal timer with the scan count time. The scan count time is the time during which the counter 46 is operable to count the output pulses from the comparator 44. Thereafter, at block 132, the microprocessor 40 clears the timer interrupt flag to allow a new interrupt to occur. The microprocessor 40 then proceeds from block 132 to block 134 to determine whether a hot level delay flag has been set. If so, the microprocessor at block 136 delays the start of the counter 46 by the programmed delay period so as to compensate for a highly sensitive acoustic wave cavity and to prevent an overflow of the counter 46. If the hot level delay flag has not been set as determined at block 134, the microprocessor 40 proceeds directly to block 138. The microprocessor 40 also proceeds from block 136 to block 138. At block 138, the microprocessor resets the counter 46, also designated timer 0. As soon as the counter 46 is reset to zero, the counter 46 starts counting the pulses output from the comparator 44. At block 140, the microprocessor 40 turns on the timer 1 for timing the scan count time. Thereafter, at block 142, the microprocessor returns from the current background process to continue the foreground process depicted in FIG. 8. This foreground process again will be interrupted when the timer 1 generates the timer 1 interrupt indicating that the scan count time for the current sampling cycle has been completed so that a new scan or sampling cycle can be started. As discussed above, the scan count time represents the second portion of the sampling cycle wherein the counter 46 is counting the pulses generated by the comparator 44.

Returning to FIG. 9B, if a no touch condition was reported at block 124 on the output Gp0, the microprocessor proceeds from block 126 to block 144 so as to update the "cavity value," i.e. the running average touch count value for an untouched acoustic wave cavity, so as to enable the touch threshold to be updated as well. The touch threshold is updated so as to compensate for drift due to changes in temperature, etc. At block 144, the microprocessor 40 determines whether the set level flag was previously set. The set flag is set to prevent a touch on the acoustic wave cavity during the initialization process from causing an error. If the flag was set, the microprocessor at block 146 sets the "cavity value" to the "touch count" measured for the current scan. Thereafter, at block 148, the microprocessor determines whether the hot level check flag was set and if so, at block 150 the microprocessor 40 calls the hot level check routine. The hot level check routine is implemented by the microprocessor at block 152 and if the timer 0 overflow flag has been set as a result of the hot level check routine or the touch count is greater than E0 Hex, then the microprocessor 40 sets the hot level delay flag at block 153. From either blocks 150 or 153, the microprocessor proceeds to block 154.

At block 154, the microprocessor 40 compares the "touch count" to the "cavity value." If the difference between the "touch count" and "cavity value" is greater than or equal to a predefined difference value, for example 5, then the microprocessor assumes that a change in the "cavity value" is needed at block 156. If a change is needed, the microprocessor at block 156 sets the "cavity value" to the current "touch count." Thereafter, at block 158, the microprocessor 40 compares the "touch count" to the "cavity value." If the two values are not equal, at block 160, the microprocessor determines the cavity direction. The cavity direction is up if the current "touch count" is greater than the "cavity value" and the direction is down if the "touch count" is less than the "cavity value." At block 162, the microprocessor 40 calculates the difference between the current "touch count" and the "cavity value." A "second difference count" is then incremented at block 164. The microprocessor at block 166, looks at the "second difference count" to determine which comparison value is to be used in the next step. If the "second difference count" is less than a "second difference compare" value which may be, for example, 48, the microprocessor proceeds from block 166 to block 168. However, if the "second difference count" is equal to the "second difference compare" value, i.e. 48, the microprocessor proceeds from block 166 to block 170. If the path from block 166 to block 168 is taken, the microprocessor at block 168 sets a difference compare to a primary level so that the microprocessor selects a "compare value" of for example 2 for a stainless steel acoustic wave cavity or 4 for an aluminum acoustic wave cavity, the compare value varying depending upon the material of the acoustic wave cavity 14. If the path from block 166 to block 170 is taken, at block 170, the microprocessor sets the difference compare to a secondary level. When set to the secondary level, the "compare value" is a calculated value and in particular is set equal to one-half of the "cavity value." From block 170, the microprocessor proceeds to block 172 to reset the "second difference count" to 0. The "second difference" correction allows slow adjustments to be made for larger than normal long term errors in the cavity value setting. From either blocks 172 or blocks 168, the microprocessor proceeds to block 174. At block 174, the microprocessor 40 compares the difference calculated at blocks 162 between the "touch count" and the "cavity value" to the "compare value" selected at either blocks 168 or block 170. If the difference calculated at block 162 is less than the selected compare value, the microprocessor proceeds from block 174 to block 176 to increment or decrement the cavity value depending on the cavity value direction set at block 160. In particular, if the cavity direction is up, the "cavity value" will be incremented at block 176. If the cavity direction set at block 160 is down, the "cavity value" will be decremented by one at block 176. This process at block 176 is a method of changing the "cavity value" so that it represents a running average of the touch count for an untouched acoustic wave cavity 14. It should be apparent that other methods of generating an average of the touch count can be used as well.

From block 176, the microprocessor proceeds to block 178 to update the threshold value representing the touch threshold from a look up table that is associated with the material forming the acoustic wave cavity 14. In a preferred embodiment, the look up table stores a number of threshold values corresponding to different "cavity values" or different cavity value ranges so that the threshold value will be selected based upon the "cavity value" determined at block 176. In this way, the touch threshold is updated so as to account for drift caused by temperature changes, etc. It is noted that instead of using a look up table, the threshold can be a value that is calculated as a function of the "cavity value." From block 178, the microprocessor 40 proceeds to block 180 so as to clear the "touch count," resetting the "touch count" value to zero in order for a new touch condition or no touch condition to be reported Gp0. If the microprocessor determines at block 174 that the difference calculated at block 162 is greater than the "compare value" determined at blocks 168 or 170, the "cavity value" and the threshold value are not updated. Instead, the microprocessor 40 proceeds directly to block 180 from block 174. From block 180, the microprocessor 40 proceeds to block 128 to trigger a new sampling cycle, i.e. a new scan as discussed above.

If the microprocessor 40 is in the diagnostic mode as determined at block 120, the diagnostic data reported at block 124, on an output pin of the controller 30 includes the following: the current touch or no touch condition of the acoustic wave cavity 14; the current value of the "touch count"; the current "cavity value"; the current value of the threshold; the low side cavity count determined at block 68; the high side cavity count as determined at block 76; and the "threshold adjustment" determined at block 78. The diagnostic data may be processed by another processor to which the controller 30 is coupled or the data may be transmitted to a remote computer for processing. Further, the microprocessor 40 may do various diagnostics on the data as well. In particular, a processor may compare the current touch count to a malfunction reference value to determine whether the switch has malfunctioned. For example, if the touch count is too high or too low signifying a malfunction, the processor performing the diagnostics generates a signal representing the malfunction of a particular switch. In response to the malfunction signal, a visual indication is provided by a display or the lighting of an LED or the like associated with the switch to indicate that the switch has malfunctioned. Alternatively, or in addition thereto, the processor performing the diagnostics may compare the "cavity value" representing an average of the "touch count" values to a reference to determine whether the switch has malfunctioned. The processor may also perform a diagnostic test wherein a number of touch count values measured over consecutive sampling cycles or scans are compared to a first reference to determine whether the values are greater than the first reference and are also compared to a second reference to determine whether the values are less than the second reference. If the touch count values are either greater than the first reference or less than the second reference, then a malfunction will be indicated. This type of diagnostic is useful in determining whether there is a contaminant on an acoustic wave cavity such that the cavity registers a touch condition for a period of time that is much longer than a typical touch on the acoustic wave cavity. In a further diagnostic test, the processor may determine a trend in the "touch count" values measured over a period of time or a trend in the "cavity values" measured over a period of time to determine a trend that may be indicative of a switch malfunction or of an impending switch malfunction. As a result of each of the diagnostics, the processor provides a signal indicative of the switch malfunction, the signal being used to control a display or light, an LED or the like to provide an indication that a switch has malfunctioned. It is noted, that the signal indicating switch malfunction may also be used to disable one switch and enable another switch or to change the functions controlled by the malfunctioning switch to a properly functioning switch.

The microprocessor 40 or another processor as discussed above can also determine whether there is liquid interference with an acoustic wave switch/sensor. Although shear waves are generally insensitive to liquids such as water, it has been discovered that when a shear wave is trapped in an acoustic wave cavity, other types of acoustic waves can also be generated in the cavity wherein these other acoustic waves are sensitive to water at levels equal to one-half of the wavelength of the acoustic wave. In the presence of rain, or the like where the level of water on an acoustic wave cavity is varying, the "touch count" values over consecutive sampling cycles will flicker such that in one sampling cycle the touch count will represent, for example, a touch, and in the next sampling cycle, the touch count will represent a no-touch condition then, for example, two touch conditions followed by a no-touch condition and so on with the level of the touch count varying with the water level. The microprocessor 40 or another processor can analyze the touch count over consecutive sampling periods for variations among the values indicative of the presence of an interfering liquid. Moreover, the amplitude of the transducer signal can be analyzed as well to determine whether a flickering condition, indicative of the presence of an interfering liquid, is present.

The circuit 10 may be used to drive and respond to a number of acoustic wave switches/sensors. For example, 16 acoustic wave transducers, each associated with a different acoustic wave cavity, can be coupled to one controller 30. For applications such as a computer keyboard having more than 16 acoustic wave switches, one master processor may be coupled to and control a number of controllers 30, each of which is in turned coupled to a number of acoustic wave transducers. Depending on the configuration of the controller used, a multiplexor may or may not be needed to handle multiple acoustic wave transducers. If a multiplexor is used, the multiplexor is preferably disposed between the capacitor 32 and the transducers 12, 12'.

In accordance with another aspect of the present invention, the circuit 10 is contained on a printed circuit board 200 that is bonded to a surface of the substrate 18 in which the acoustic wave cavity is formed. In this configuration, the entire acoustic wave switch or sensor panel is extremely compact and rugged, the printed circuit board adding strength to the switch/sensor panel that is comprised of the substrate 18 with one or more acoustic wave cavities formed therein. The printed circuit board 200 includes a plurality of apertures 202 that are slightly larger than the surface area of the acoustic wave cavity surface on which the transducer 12 is mounted.

Figure 11:
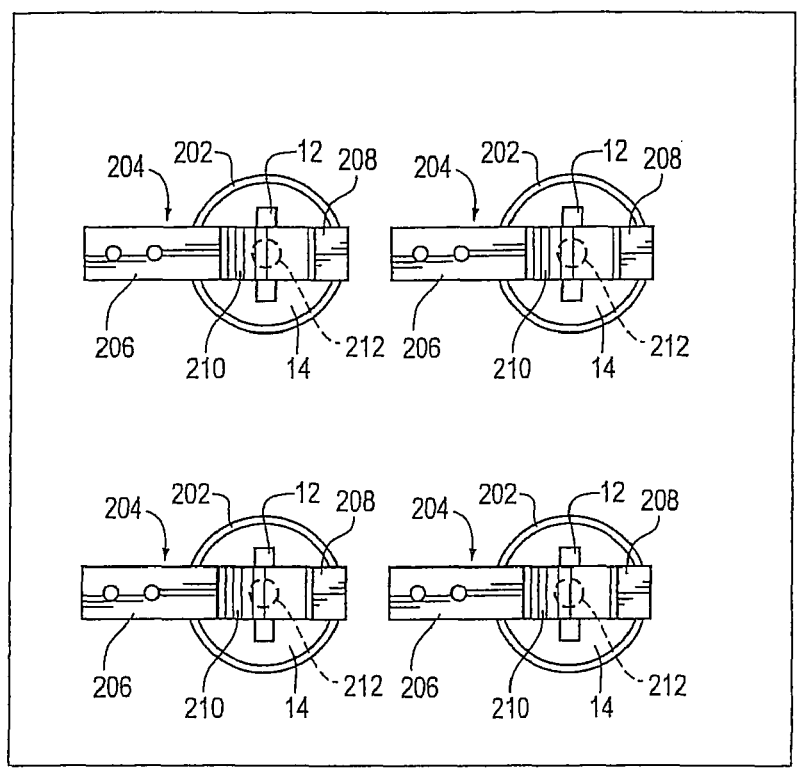
FIG. 11 is a bottom view of the circuit board of FIG. 10 for a number of acoustic wave cavities.
Figure 12:
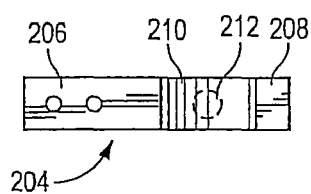
FIG. 12 is a bottom view of the transducer contact shown in FIGS. 10 and 11.
Figure 13:
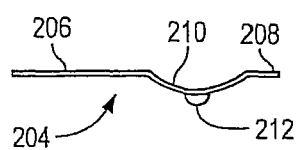
FIG. 13 is a side view of the transducer contact of FIGS. 10-12.

When the circuit board 200 is bonded to the substrate 18 with the apertures 202 aligned with the cavities 14, the circuit board 200 will not contact the acoustic wave cavity. Since the circuit board 200 does not contact the acoustic wave cavity 14, the circuit board 200 does not affect the operation of the acoustic wave cavity. A cantilevered contact 204 has a first end 206 soldered to the circuit board on one side of the aperture 202. The other end 208 of the cantilevered 204 rests on the circuit board 200 on an opposite side of the aperture 202. A portion 210 of the cantilevered contact 204 between the ends 206 and 208 is arched downward, in the manner of a shallow bowl or spoon. The contact is preferably formed of a material such as beryllium copper with gold flash plating. As shown in FIGS. 12 and 13, a conductive elastomer drop 212 is disposed on the bottom surface portion 210 of the contact in a position so that when the circuit board is properly mounted on the substrate 18, the elastomer 212 contacts the transducer 12. More particularly, upon mounting the circuit board 200 with the apertures 202 aligned with a respective acoustic wave cavity 14, the contact 204 flexes like a cantilevered spring and the conductive elastomer compresses when it contacts the transducer 12. The conductive elastomer 212 provides a seal between the contact and the transducer 12 and further prevents abrasion of the metal contact 204 against the transducer 12. In a preferred embodiment, the printed circuit board 200 is bonded onto the substrate 18 with an insulator 214 disposed between the circuit board 200 and the substrate 18. In a preferred embodiment, the insulator is a 0.005 inch mylar insulator that has an adhesive coated on an upper and lower surface of the insulator so that the insulator bonds the circuit board 200 to a surface of the substrate 18 opposite the touch responsive surface 24 of the acoustic wave cavity 14. FIG. 11 illustrates a top view of the printed circuit board mounted on the back side of the substrate 18 having a number of acoustic wave cavities 14 formed therein. It is noted, that for an acoustic wave cavity having a diameter of 0.350 inch, the diameter of the aperture 202 in the circuit board associated with each of the cavities need only have a diameter of on the order of 0.375 inch so as to provide a slight clearance for the acoustic wave cavity. It is noted that when EMATS are used, the EMAT may be mounted on the circuit board in apertures that do not extend through the thickness of the substrate but only through a portion thereof.

In accordance with a further aspect of the present invention as shown in FIGS. 14-17, the acoustic wave cavity 14 is formed in a substrate that is an insert 220, wherein the insert 220 can be mounted in an aperture of a sensor support. The insert 220 is a stamped disk formed with a raised area 224 that defines an acoustic wave cavity 14 as discussed above. Because the disk 220 is a stamped piece of metal the sensor disk 220 can be manufactured very cheaply. In a preferred embodiment, the raised area has the shape of a truncated dome with an outer, circular periphery 226 with a diameter of, for example, 0.30 inch. The diameter of the periphery 228 of the truncated portion of the dome can vary. The periphery 230 of the sensor disk insert 220 is spaced from the acoustic wave cavity 14 and has a diameter of, for example, 0.50 inch. The sensor disk periphery 230 also includes a flange 232 extending thereabout so as to engage a corresponding flange 234 on the sensor support 222 of FIG. 14. The diameter of the periphery's flange portion may be, for example, 0.58 inch. The sensor disk may be very thin such as on the order of 0.0650 inch where the height of the raised area 224 is as described in U.S. patent application Ser. No. 09/998,355 filed Nov. 20, 2001 and incorporated herein by reference.

Figure 14:
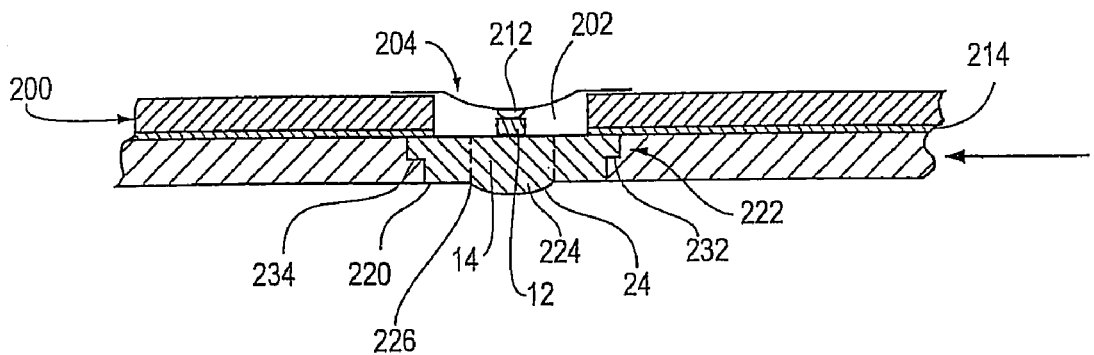
FIG. 14 is a cross-sectional view illustrating a sensor disk insert for a panel with a circuit board bonded thereto.
Figure 15:
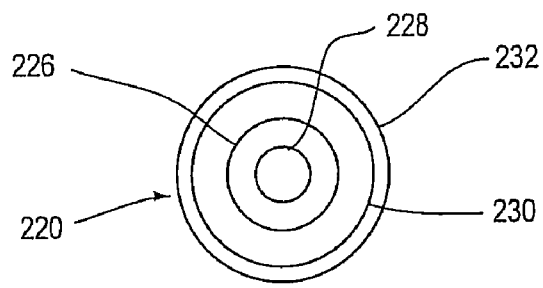
FIG. 15 is a top view of the sensor disk of FIG. 14.

In FIG. 14, the support 222 for the sensor disk 220 is planar and may be a panel, plate or the like having an aperture to receive the sensor disk. The periphery of the sensor disk is preferably secured in the support 222 by an adhesive/sealant. The circuit board 200 is then bonded to a peripheral bottom portion of the sensor disk 220 and the support 222 by means of an insulator 214 with an adhesive coating on both of its surfaces. When bonded, the aperture 202 in the circuit board is aligned with the acoustic wave cavity 14 and the contact 204 positively contacts the transducer 12 as discussed above.

Figure 16:
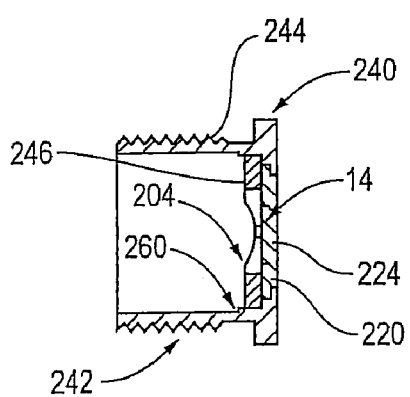
FIG. 16 is a cross-sectional view of a sensor disk in an individual sensor housing or support.
Figure 17:
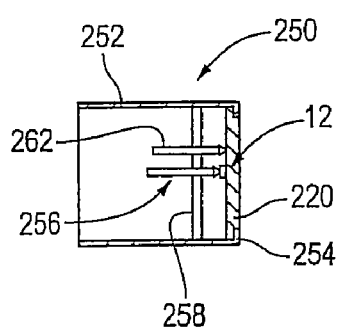
FIG. 17 is a cross-sectional view of a sensor disk in an alternative embodiment on an individual sensor housing or support.

In the alternative embodiments shown in FIGS. 16 and 17, the support for the sensor disk has a cylindrical body. More particularly, as shown in FIG. 16, the sensor disk 220 is mounted in an aperture of a head portion 240 of a screw-like support 242. The support 242 has a cylindrical body with threads 244 on at least a portion of an outer surface thereof. The sensor formed of the sensor disk 229 and support 242 is readily mounted in any member having an aperture that accommodates the cylindrical body and can be maintained therein by means of a nut or the like that engages the threads 244. In a preferred embodiment, the support 242 is hollow so that a contact such as the contact 204 can be disposed therein. As shown, the contact is mounted on a circuit board washer 246. The circuit board washer 246 is annular in shape, having an aperture aligned with the acoustic wave cavity 14. The washer is bonded to a peripheral portion of a back surface of the sensor disk spaced from the acoustic wave cavity 14 and to a back or inner portion of the head 240 of the support 242. The circuit board washer 246 provides a connection from the contact 204, and thus the transducer 12, to pins or a connector carried on the washer where the washer pins/connector is coupled to leads extending through the hollow portion of the support and to a remote circuit board via the leads. Alternatively, the washer pins/connector provide a direct connection to a circuit board that is mounted in the hollow portion of the support 242 as shown below with respect to FIG. 17.

In the embodiment of FIG. 17, the support 250 has a cylindrical body 252 and a flange 254 at one end for engaging the sensor disk 220. The flange 254 forms an aperture in the support 250 into which the sensor disk portion containing the acoustic wave cavity 14 extends. The transducer 12 is engaged by a spring pin contact 256 that connects the transducer 12 to the circuit board 258. In a preferred embodiment, the circuit board 258 rests on a lip formed on an inner surface of the hollow portion of the support. The lip may be formed as depicted at 260 in FIG. 16. A second spring pin 262 forms a connection to ground.

The sensor disk can be formed of any material capable of supporting a trapped or resonant acoustic wave such as a metal, ceramic, etc. The support 222, 224, 250 may be formed of any material desired for the application for which the sensor is to be used.

Many modifications and variations of the present invention are possible in light of the above teachings. Thus, it is to be understood that, within the scope of the appended claims, the invention may be practiced otherwise than as described hereinabove.

What is claimed and desired to be secured by Letters Patent is:

1. A touch detection circuit for detecting a touch on a touch responsive acoustic wave cavity comprising:
   at least one transducer driven to generate an acoustic wave in the cavity during a sampling cycle and responsive to the acoustic wave to provide a signal representative thereof for the sampling cycle; and
   a controller responsive to the acoustic wave signal to determine a number representing the period of time that the acoustic wave signal for a sampling cycle decays to a predetermined level, and the controller comparing the number for a sampling cycle to a touch reference to detect a presence of a touch on the acoustic wave cavity during the sampling cycle.

2. A touch detection circuit as recited in claim 1 wherein said controller includes a processor and memory, the predetermined level being programmable and the processor determining the touch reference.

3. A touch detection circuit as recited in claim 2 wherein the processor determines the touch reference based on a look up table stored in the memory.

4. A touch detection circuit as recited in 2 wherein the processor determines the touch reference based on at least one number representing the period of time that the acoustic wave signal for a sampling cycle decays to a predetermined level in the absence of a touch on the acoustic wave cavity.

5. A touch detection circuit as recited in claim 1 wherein the controller determines the touch reference based on a plurality of numbers each representing a respective period of time that the acoustic wave signal for respective sampling cycle decays to a predetermined level in the absence of a touch on the acoustic wave cavity.

6. A touch detection circuit as recited in claim 1 wherein the controller includes a comparator that receives an acoustic wave signal for a sampling cycle and compares the amplitude of the acoustic wave signal to a predetermined amplitude to generate a pulse when the amplitude of the acoustic wave signal is greater than the predetermined amplitude.

7. A touch detection circuit as recited in claim 6 wherein the controller counts the number of pulses from the comparator for an acoustic wave signal received for a sampling cycle to determine the number representing the period of time that the acoustic wave signal decays to the predetermined level.

8. A touch detection circuit as recited in claim 1 wherein the transducer is a piezoelectric transducer.

9. A touch detection circuit as recited in claim 1 wherein the transducer is an electromagnetic acoustic transducer.

10. A touch detection circuit for detecting a touch on a touch responsive acoustic wave cavity comprising:
    at least one transducer to generate an acoustic wave in the cavity when the transducer is driven and responsive to the acoustic wave in the cavity to provide a signal representative thereof;
    a controller that controls the driving of the at least one transducer and the receipt of the acoustic wave signal from the transducer during a sampling cycle, the controller being responsive to the transducer signal to determine a number representing the period of time that the signal, received from the transducer during a sampling cycle, decays to a predetermined level, and the controller comparing the number for a sampling cycle to a touch reference to detect the presence of a touch on the acoustic wave cavity during the sampling cycle.

11. A touch detection circuit for detecting a touch on a touch responsive acoustic wave cavity comprising:
    at least one transducer driven to generate an acoustic wave in the cavity during a sampling cycle and responsive to the acoustic wave to provide a signal representative thereof for the sampling cycle;
    a comparator for comparing the amplitude of the acoustic wave signal for a sampling cycle to a first reference to generate a pulse when the amplitude of the acoustic wave signal is above the first reference;
    a counter for counting a number of the pulses from the comparator to provide a count for the sampling cycle; and
    a processor for comparing the count for the sampling cycle to a second reference to detect a touch.

12. A touch detection circuit as recited in claim 11 wherein the processor controls the generation of the acoustic wave in the cavity and the coupling of the acoustic wave signal to the comparator.

13. A touch detection circuit as recited in claim 11 wherein the processor is responsive to the counts for a plurality of sampling cycles to update the second reference used to detect a touch.

14. A touch detection circuit as recited in claim 13 wherein the processor uses a table stored in a memory to determine the second reference.

15. A touch detection circuit as recited in claim 11 wherein the processor updates the reference.

16. A touch detection circuit as recited in claim 11 wherein the transducer is a piezoelectric transducer.

17. A touch detection circuit as recited in claim 11 wherein the transducer is an electromagnetic acoustic transducer.

18. A touch detection circuit for detecting a touch on a touch responsive acoustic wave cavity comprising:
   an electromagnetic acoustic transducer having a coil and at least one magnet, the electromagnetic acoustic transducer being positioned adjacent the acoustic wave cavity; and
   a controller coupled to the coil to drive the transducer to generate an acoustic wave in the acoustic wave cavity and to pick up a signal from the transducer representing the acoustic wave in the acoustic wave cavity, the controller is responsive to the signal to determine a value representing the period of time that the acoustic wave signal decays to a predetermined level, the value being indicative of the presence or absence of a touch on the touch responsive acoustic wave cavity.

19. A touch detection circuit as recited in claim 18 wherein the electromagnetic acoustic transducer includes a single coil for generating the acoustic wave and for picking up a signal representing the acoustic wave.

20. A touch detection circuit as recited in claim 18 wherein the electromagnetic acoustic transducer includes multiple coils.

21. A circuit for an acoustic wave sensor comprising:
   at least one transducer driven to generate a resonant acoustic wave in an acoustic wave resonator and responsive to the acoustic wave to provide a signal representative thereof;
   a controller responsive to the signal for determining a value representing the period of time that the acoustic wave decays to a predetermined level, the controller comparing the value to a reference to sense an event.

22. A method of detecting switch malfunction for an acoustic wave switch comprising:
   generating an acoustic wave in the acoustic wave switch;
   providing a signal representing the acoustic wave in the acoustic wave switch;
   determining a value representing the period of time that the acoustic wave decays to a predetermined level; and
   comparing the determined value to a malfunction reference to determine whether the switch has malfunctioned.

23. A method of detecting switch malfunction as recited in claim 22 including providing an indication of switch malfunction in response to a determination that a switch has malfunctioned.

24. A method of detecting switch malfunction as recited in claim 22 including generating a signal representing switch malfunction in response to a determination that a switch has malfunctioned.

25. A method of detecting switch malfunction for an acoustic wave switch comprising:
   generating an acoustic wave in the acoustic wave switch during each of a plurality of sampling periods;
   providing a signal representing the acoustic wave in the acoustic wave switch in each of the sampling periods;
   determining, for each of the sampling periods, a value representing the period of time that the acoustic wave decays to a predetermined level; and
   comparing a plurality of the determined values to a reference to determine whether the switch has malfunctioned.

26. A method of detecting switch malfunction as recited in claim 25 including providing an indication of switch malfunction in response to a determination that a switch has malfunctioned.

27. A method of detecting switch malfunction as recited in claim 25 including generating a signal representing switch malfunction in response to a determination that a switch has malfunctioned.

28. A method of detecting switch malfunction as recited in claim 25 wherein switch failure is determined when the values for a predetermined number of consecutive sampling periods have been greater than or less than the reference.

29. A method of detecting impending switch malfunction for an acoustic wave switch comprising:
   generating an acoustic wave in the acoustic wave switch during each of a plurality of sampling periods;
   providing a signal representing the acoustic wave in the acoustic wave switch in each of the sampling periods;
   determining, for each of the sampling periods, a value representing the period of time that the acoustic wave decays to a predetermined level;
   determining a trend from a plurality of the determined values indicative of impending switch malfunction.

30. A method of detecting impending switch malfunction as recited in claim 29 including providing an indication of impending switch malfunction in response to a determination of a trend indicative of impending switch malfunction.

31. A method of detecting impending switch malfunction as recited in claim 29 including generating a signal representing impending switch malfunction in response to a determination of a trend indicative of impending switch malfunction.

32. A method of detecting switch malfunction for an acoustic wave switch comprising:
   generating an acoustic wave in the acoustic wave switch during each of a plurality of sampling periods;
   providing a signal representing the acoustic wave in the acoustic wave switch in each of the sampling periods;
   determining, for each of the sampling periods, a first value representing the period of time that the acoustic wave decays to a predetermined level;
   determining a second value representing an average of a plurality of the first values; and
   comparing the second value to a reference to determine whether the switch has malfunctioned.

33. A method of detecting liquid interference with an acoustic wave sensor comprising:
   generating an acoustic wave in the acoustic wave switch during each of a plurality of sampling periods the acoustic wave being insensitive to the liquid at certain levels of the liquid and the acoustic wave being sensitive to the liquid at other levels;
   providing a signal representing the acoustic wave in the acoustic wave switch in each of the sampling periods; and
   analyzing the signals in a predetermined number of consecutive sampling periods for variations among the signal indicative of the presence of an interfering liquid.

34. A method of detecting liquid interference as recited in claim 33 wherein the analyzing includes determining, for each sampling period, a value representing the period of time that the acoustic wave decays to a predetermined level.

35. A method of detecting liquid interference as recited in claim 34 including comparing a maximum value and a minimum value to determine if the difference therebetween exceeds a threshold.

36. An acoustic wave touch panel comprising:
a substrate having a plurality of wave cavities formed therein and defined by an area of increased mass, the substrate having a surface with touch responsive areas associated with the acoustic wave cavities and a back surface opposite thereto;
a transducer positioned adjacent the back surface of each of the acoustic wave cavities;
a circuit board having a circuit for driving the transducers to generate an acoustic wave in each of the acoustic wave cavities, the circuit board having a plurality of apertures and the circuit board being bonded on the back surface of the substrate wherein each aperture is aligned with a respective acoustic wave cavity.

37. An acoustic wave touch panel as recited in claim 36 including at least one contact associated with each transducer, the contact having a first end attached to the circuit board and a second end extending over a respective aperture for contact with the transducer.

38. An acoustic wave touch panel as recited in claim 37 wherein the contact is a cantilevered contact.

39. An acoustic wave touch panel as recited in claim 37 wherein the contact is a spring.

40. An acoustic wave touch panel as recited in claim 37 wherein the second end of the contact includes a conducting plastic.

41. An acoustic wave touch panel as recited in claim 36 wherein the transducers are mounted on the substrate and extend into respective apertures of the circuit board.

42. An acoustic wave touch panel as recited in claim 36 wherein the transducers are mounted on the circuit board in the apertures.

43. An acoustic wave touch panel as recited in claim 42 wherein the transducers are electro-magnetic acoustic wave transducers.

44. An acoustic wave sensor comprising:
a substrate having an acoustic wave cavity defined by an area of increased mass, the acoustic wave cavity having a surface responsive to a sensed event and a back surface opposite thereto;
a transducer mounted on the back surface of the acoustic wave cavity; and
a circuit board with an aperture and a contact extending over the aperture, the circuit board being bonded onto the substrate with the aperture aligned with the acoustic wave cavity and the contact contacting the transducer.

45. An acoustic wave sensor of claim 44 wherein the contact is a cantilevered contact.

46. An acoustic wave sensor of claim 44 wherein the contact is a spring contact.

47. An acoustic wave sensor of claim 44 wherein the contact includes a conducting elastomer contacting the transducer.

48. An acoustic wave sensor of claim 44 wherein the circuit board couples a drive signal to the transducer and picks up a signal from the transducer for analysis.

49. An acoustic wave sensor of claim 44 wherein the area of increased mass is a raised area.

50. An acoustic wave sensor comprising:
an acoustic wave cavity insert having an area of increased mass defining an acoustic wave cavity, the acoustic wave cavity having a surface responsive to an event to be sensed and a back surface opposite thereto and the insert having a periphery shaped to allow the acoustic wave cavity insert to be mounted in an aperture of a sensor support;
at least one transducer mounted on the back surface of the acoustic wave cavity of the insert.

51. An acoustic wave sensor of claim 50 wherein the area of increased mass is a raised area.

52. An acoustic wave sensor of claim 51 including a contact support having an aperture aligned with the acoustic wave cavity and a contact extending from the contact support over the aperture to contact the transducer.

53. An acoustic wave sensor of claim 52 wherein the contact support has a second contact for connection to a circuit board.

54. An acoustic wave sensor of claim 52 wherein the sensor support is planar.

55. An acoustic wave sensor of claim 50 including a circuit board having an aperture and a contact extending over the aperture, the circuit board being bonded onto the substrate with the aperture aligned with the acoustic wave cavity and the contract contacting the transducer.

56. An acoustic wave sensor of claim 52 wherein the sensor support has a cylindrical portion with a threaded outer surface.

57. An acoustic wave sensor component comprising:
a stamped insert having a raised area defining an acoustic wave cavity and a periphery spaced from the acoustic wave cavity and shaped to allow the acoustic wave insert to be mounted in an aperture of a sensor support.

58. An acoustic wave sensor component as recited in claim 57 wherein the cavity has a generally circular periphery.

59. An acoustic wave sensor component as recited in claim 57 wherein the periphery of the insert includes a flange for engaging a member of the sensor support.

60. An acoustic wave sensor component comprising:
a sensor disk having a raised area with a generally circular periphery formed thereon, the raised area defining an acoustic wave cavity, the sensor disk having a periphery spaced from the acoustic wave cavity and shaped to allow the sensor disk to be mounted in an aperture of a support for the sensor disk.

61. An acoustic wave sensor component as recited in claim 60 wherein the sensor disk is stamped.

62. An acoustic wave sensor component as recited in claim 60 wherein the raised area of the sensor disk is a truncated dome.

63. An acoustic wave sensor component as recited in claim 60 wherein the periphery of the sensor disk includes a flange for engaging a member of the sensor support.

64. An acoustic wave sensor of claim 60 wherein the sensor support is planar.

65. An acoustic wave sensor of claim 60 wherein the sensor support has a cylindrical portion with a threaded outer surface.

66. An acoustic wave sensor of claim 60 wherein the sensor support has a cylindrical portion.

* * * * *